United States Patent
Hildreth et al.

(10) Patent No.: US 8,278,191 B2
(45) Date of Patent: Oct. 2, 2012

(54) METHODS AND SYSTEMS FOR METAL-ASSISTED CHEMICAL ETCHING OF SUBSTRATES

(75) Inventors: Owen Hildreth, Pacific Grove, CA (US); Ching Ping Wong, Berkeley Lake, GA (US); Yonghao Xiu, Santa Clara, CA (US)

(73) Assignee: Georgia Tech Research Corporation, Atlanta, GA (US)

( * ) Notice: Subject to any disclaimer, the term of this patent is extended or adjusted under 35 U.S.C. 154(b) by 119 days.

(21) Appl. No.: 12/751,080

(22) Filed: Mar. 31, 2010

(65) Prior Publication Data
US 2010/0248449 A1   Sep. 30, 2010

Related U.S. Application Data

(60) Provisional application No. 61/165,265, filed on Mar. 31, 2009.

(51) Int. Cl.
*H01L 21/00* (2006.01)

(52) U.S. Cl. .......... 438/460; 438/728; 438/732

(58) Field of Classification Search .......... 438/745, 438/460, 728, 732
See application file for complete search history.

(56) References Cited

U.S. PATENT DOCUMENTS

| | | | |
|---|---|---|---|
| 6,605,548 B1 | 8/2003 | Bardwell | |
| 6,734,077 B2 | 5/2004 | Forster et al. | |
| 6,762,134 B2 * | 7/2004 | Bohn et al. | 438/745 |
| 6,790,785 B1 * | 9/2004 | Li et al. | 438/745 |
| 7,012,012 B2 | 3/2006 | Yeom et al. | |
| 7,291,284 B2 | 11/2007 | Mirkin et al. | |
| 7,718,254 B2 * | 5/2010 | Matsumura et al. | 428/317.9 |
| 8,053,270 B2 * | 11/2011 | Dimitrov et al. | 438/71 |
| 2003/0029837 A1 * | 2/2003 | Trow | 216/67 |
| 2007/0051942 A1 | 3/2007 | Brown et al. | |
| 2007/0273263 A1 | 11/2007 | Hudspeth et al. | |
| 2008/0107892 A1 | 5/2008 | Jiao et al. | |
| 2008/0286975 A1 | 11/2008 | Alapati et al. | |

OTHER PUBLICATIONS

V. E. Bochenkov & G. B. Sergeev. Nanomaterials for sensors. Russian Chemical Review, vol. 76 (11), pp. 1084-1093, 2007.

A. Huczko. Template-based synthesis of nanomaterials. Applied Physics A: Materials Science and Processing, vol. 70 (4), pp. 365-376, Mar. 2000.

M. Endo, M. S. Strano, & P. M. Ajayan. Potential Applications of Carbon Nanotubes. Topics in Applied Physics, vol. 111 pp. 13-61, Jan. 2008.

T. Ito, T. Yamada, Y. Inao, T. Yamaguchi, & N. Mizutani. Fabrication of half-pitch 32 nm resist patterns using near-field lithography with a-Si mask. Applied Physics Letters, vol. 89 (033113), pp. 1-3, Jul. 2006.

(Continued)

*Primary Examiner* — David Vu
*Assistant Examiner* — Caleb Henry
(74) *Attorney, Agent, or Firm* — Thomas, Kayden, Horstemeyer & Risley, LLP

(57) ABSTRACT

Disclosed herein are various embodiments related to metal-assisted chemical etching of substrates on the micron, sub-micron and nano scales. In one embodiment, among others, a method for metal-assisted chemical etching includes providing a substrate; depositing a non-spherical metal catalyst on a surface of the substrate; etching the substrate by exposing the non-spherical metal catalyst and the substrate to an etchant solution including a composition of a fluoride etchant and an oxidizing agent; and removing the etched substrate from the etchant solution.

20 Claims, 11 Drawing Sheets

OTHER PUBLICATIONS

C. Klinke, E. Delvigne, J. V. Barth, & K. Kern. Enhanced field emission from multiwall carbon nanotube films by secondary growth. Journal of Physical Chemistry: B, vol. 109 (21677), pp. 1-5, Apr. 2006.

Boltasseva & V. M. Shalaev. Fabrication of optical negative-index metamaterials: Recent advances and outlook. Metamaterials, vol. 2 (1), pp. 1-7, May 2008.

R. Murali, D. K. Brown, K. P. Martin, & J. D. Meindl. Process optimization and proximity effect correction for gray scale e-beam lithography. Journal of Vacuum Science and Technology B, vol. 24 (6), pp. 2936-2939, Nov. 2006.

M. Austin, H. Ge, W. Wu, M. Li, Z. Yu, D. Wasserman et al. Fabrication of 5 nm linewidth and 14 nm pitch features by nanoimprint lithography. Applied Physics Letters, vol. 84 (26), pp. 5299, Jun. 2004.

K. J. Morton, G. Nieberg, S. Bai, & S. Y. Chou. Wafer-scale patterning of sub-40 nm diameter and high aspect ratio (<50:1) silicon pillar arrays by nanoimprint and etching. Nanotechnology, vol. 19 (345301), pp. 1-6, Jul. 2008.

S. P. Patole, P. S. Alegaonkar, H. C. Shin, & J. B. Yoo. Alignment and wall control of ultra long carbon nanotubes in water assisted chemical vapour deposition. J. Phys. D: Appl. Phys, vol. 41 (155311), pp. 1-6, Jul. 2008.

Z. L. Wang. Self-assembled nanoarchitectures of polar nanobelts/nanowires. Journal of Materials Chemistry, (15), pp. 1021-1024, 2005.

S. Spiesshoefer, L. Schaper, S. Burkett, & G. Vangara, Z-axis interconnects using fine pitch, nanoscale through-silicon vias: Process development. Proc. of Electronic Components and Technology Conference, vol. 1, pp. 466-471, Jun. 2004.

P. Ramm, M. J. Wolf, A. Klumpp, R. Wieland, & B. Wunderle, Through silicon via technology—processes and reliability for wafer-level 3D system integration. Proc. of Electronic Components and Technology Conference, vol. 1, pp. 841-846, May 2008.

M. Tian & M Bartek. Simultaneous through-silicon via and large cavity formation using deep reactive ion etching and aluminum etch-stop layer. Electronic Components and Technology Conference, pp. 1787-1792, May 2008.

Y. Xiu, L. Zhu D. W. Hess, & C. P. Wong. Hierarchical Silicon Etched Structures for Controlled Hydrophobicity/Superhydrophobicity. Nano Letter, vol. 7 (11), pp. 3388-3393, Oct. 2007.

T. Hadjersi, N. Gabouze, E. S. Kooij, & A. Zinine. Metal-assisted chemical etching in HF/Na2S2O8 or HF/KMnO4 produces porous silicon. Thin Solid Films, vol. 459 (1-2), pp. 271-275, Jul. 2004.

S. Koynov, M. Brandt, & M. Stutzmann. Black nonreflecting silicon surfaces for solar cells. Applied Physics Letters, vol. 88 (20), pp. 203107 1-203107 3, May 2006.

M. Zhang, K. Peng, X. Fan, J. Jie, R. Zhang, S. Lee et al. Preparation of large-area uniform silicon nanowires arrays through metal-assisted chemical etching. J Phys Chem C, vol. 112 (12), pp. 4444-4450, Mar. 2008.

P. Gorostiza, R. Diaz, & M. Anbu Kulandainathan. Simultaneous platinum deposition and formation of a photoluminescent porous silicon layer. Journal of Electroanalytical Chemistry, vol. 469 (1), pp. 48-52, Apr. 1999.

K. Tsujino & M. Matsumura. Helical Nanoholes Bored in Silicon by Wet Chemical Etching Using Platinum Nanoparticles as Catalyst. Electrochemical and Solid-State Letters, vol. 8 (12), pp. C193-C195, Aug. 2005.

S. Yae, Y. Kawamoto, H. Tanaka, N. Fukumuro, & H. Matsuda. Formation of porous silicon by metal particle enhanced chemical etching in HF solution and its application for efficient solar cells. Electrochemistry Communications, vol. 5 (8), pp. 632-636, Jul. 2003.

C. Chartier, S. Bastide, & C. Lévy-Clément. Metal-assisted chemical etching of silicon in HF—H2O2. Electrochimica Acta, vol. 53 (17), pp. 5509-5516, Mar. 2008.

H. Itoh, R. Nakata, & T. Moriya. Creep-up phenomena in tungsten selective CVD and their application to VLSI technologies. Proc of International Electron Devices Meeting, pp. 606-609, 1985.

D. R. Bradbury, J. E. Turner, K. Nauka, & K. Y. Chiu, Selective CVD tungsten as an alternative to blanket tungsten for submicron plug applications on VLSI circuits. Proc. of Electron Devices Meeting, pp. 273-276, Dec. 1991.

K. Tsujino & M. Matsumura. Morphology of Nanoholes Formed in Silicon by Wet Etching in Solutions Containing HF and H2O2 At Different Concentrations Using Silver Nanoparticle as Catalysts. Electrochimica Acta, vol. 53 (1), pp. 28-34, Jan. 2007.

B. Schwartz & H. Robbins. Chemical Etching of Silicon. Journal of the Electrochemical Society, vol. 123 (12), pp. 1903-1909, Dec. 1976.

E. S. Kooij, K. Butter, & J. J. Kelly. Silicon Etching in HNO/HF Solution: Charge Balance for the Oxidation Reaction. Electrochemical and Solid-State Letters, vol. 2 (4), pp. 178-180, Feb. 1999.

Y. Xiu, D. W. Hess, & C. P. Wong. Preparation of multi-functional silicon surface structures for solar cell applications. Electronic Components and Technology Conference, pp. 2117-2122, May 2008.

Y. Xiu, S. Zhang, V. Yelundur, A. Rohatgi, & D. W. Hess. Superhydrophobic and Low Light Reflectivity Silicon Surfaces Fabricated by Hierarchical Etching. Langmuir, vol. 24 (18), pp. 10421-10426, Aug. 2008.

K. Peng, A. Lu, R. Zhang, and S. Lee. Motility of Metal Nanoparticles in Silicon and Induced Anisotropic Silicon Etching. Advanced Functional Materials, vol. 18, No. 19, pp. 3026-3035, Sep. 2008.

Weiss, S. M.; Haurylau, M.; Fauchet, P. Tunable Photonic Bandgap Structures for Optical Interconnects. Opt. Mater. 27, 740-744, Feb. 2005.

Yamada, K.; Fukuda, H.; Tsuchizawa, T. All-Optical Efficient Wavelength Conversion Using Silicon Photonic Wire Waveguide. IEEE Photonics Technol. Lett. 18, 1046-1048, May 2006.

Gupta, A.; Denton, J. P.; Mcnally, H.; Bashir, R. Novel Fabrication Method for Surface Micromachined Thin Single-Crystal Silicon Cantilever Beam. Microelectromech. Syst. 12, 185-192, Apr. 2003.

Kovacs, G. T. A.; Maluf, N. I.; Petersen, K. E. Bulk Micromachining of Silicon. Proceedings of the IEEE; pp. 1536-1551 (Aug. 1998).

Chattopadhyay, S.; Li, X.; Bohn, P. W. In-Plane Control of Morphology and Tunable Photoluminescence in Porous Silicon Produced by Metal-Assisted Electroless Chemical Etching. J. Appl. Phys. 91, 6134-6140, May 2002.

Huang, Z.; Zhang, X.; Reiche, M.; Liu, L.; Lee, W.; Shimizu, T.; Senz, S.; Goesele, U. Extended Arrays of Vertically Aligned Sub-10 nm Diameter [100] Si Nanowires by Metal-Assisted Chemical Etching. Nano Lett. 8, 3046-3051, Aug. 2008.

Lee, C. L.; Tsujino K.; Kanda, Y.; Ikeda, S.; Matsumura, M. Pore Formation in Silicon by Wet Etching Using Micrometre-Sized Metal Particles as Catalysts. J. Mater. Chem. 18, 1015-1020, Jan. 2008.

Tsujino, K.; Matsumura, M. Boring Deep Cylindrical Nanoholes in Silicon Using Silver Nanoparticles as a Catalyst. Adv. Mater. 17, 1045-1047, Apr. 2005.

Chun, I. S.; Chow, E. K.; Li, X. Nanoscale Three Dimensional Pattern Formation in Light Emitting Porous Silicon. Appl. Phys. Lett. 92, 191113, May 2008.

Sun, Y.; Gates, B.; Mayers, B.; Xia, Y. Crystalline Silver Nanowires by Soft Solution Processing. Nano Lett. 2, 165-168, Jan. 2002.

Paxton, W. F.; Kistler, K. C.; Olmeda, C. C.; Sen, A.; St Angelo, S. K.; Cao, Y. Y.; Mallouk, T. E; Lammert, P. E.; Crespi, V. H. Catalytic Nanomotors: Autonomous Movement of Striped Nanorods. J. Am. Chem. Soc. 126, 13424-13431, Sep. 2004.

K. Rykaczewski, O. Hildreth, D. Kulkarni, M. Henry, S.-K. Kim, C. P. Wong, V. Tsukruk, A. Fedorov. Maskless and Resist-Free Rapid Prototyping of Three-Dimensional Structures Through Electron Beam Induced Deposition (EBID) of Carbon in Combination with Metal-Assisted Chemical Etching (MaCE) of Silicon. ACS Appl. Mater. Interfaces, 2 (4), pp. 969-973, Mar. 2010.

S. Chattopadhyay, P. W. Bohn. Direct-write patterning of microstructured porous silicon arrays by focused-ion-beam Pt deposition and metal-assisted electroless etching. Journal of Applied Physics, vol. 96, Issue 11, pp. 6888-6894 (Dec. 2004).

H. W. P. Koops, A. Kaya, M. Weber. Fabrication and characterization of platinum nanocrystalline material grown by electron-beam induced deposition. J. Vac. Sci. Technol. B vol. 13, Issue 6, pp. 2400-2403 (Nov. 1995).

L. Rotkina, J. F. Lin, J. P. Bird. Nonlinear current-voltage characteristics of Pt nanowires and nanowire transistors fabricated by electron-beam deposition. Applied Physics Letters 83 (21), pp. 4426-4428 (Nov. 2003).

Botman, J. J. L. Mulders, C. W. Hagen. Creating pure nanostructures from electron-beam-induced deposition using purification techniques: a technology perspective. Nanotechnology 20 (37), 372001 (Sep. 2009).

Botman, J. J. L. Mulders, R. Weemaes, S. Mentink. Purification of platinum and gold structures after electron-beam-induced deposition. Nanotechnology 17 (15), 3779-3785 (Aug. 2006).

Z. Cui. Nanofabrication: Principles, Capabilities and Limits (1). Springer pp. 7-79 (1-350) 2008.

E. Lassner & W. Schubert. Tungsten: Properties, Chemistry, Technology of the Element, Alloys, and Chemical Compounds (1st ed.). New York: Kluwer Acadmic/Plenum, pp. 124-127 and 168-169, 1999.

F. L. LaQue & H. R. Copson. Corrosion Resistance of Metals and Alloys (2nd ed.). New York:Reinhold Publishing Corporation, pp. 660-661, 1963.

Lehmann, V. The Electrochemistry of Silicon: Instrumentation, Science, Materials and Applications. Wiley-VCH pp. 31-60 2002.

Ben, Y.; Gianchandani, Y.; Peterson, G.; Bergstrom, P.; Li, G.; Plummer, D.; Borboni, A.; Löfdahl, L.; Sobhan, C.; Muntz, E. et al. Mems Applications; Gad-el-Hak, M. (Ed.); CRC Press: Boca Raton, FL, 2005; Chapters 1-3 and 5-6, pp. 1-1 to 1-5, 2-1 to 2-33, 3-1 to 3-44, 5-1 to 5-37, 6-1 to 6-77.

Reimer, L. Scanning Electron Microscopy: Physics of Image Formation and Microanalysis; Hawkes, P., Ed.; Springer-Verlag: New York, 1998; pp. 230-240.

Polyakov Wafer-level Packaging Technology for RF Applications Based on a Ridgid Low-Loss Spacer Substrate. Ph.D Thesis, Delft University of Technology, Netherlands 2006.

D. C. Beaulieu, Electron Beam Chemical Vapor Deposition of Platinum and Carbon. M.S. Thesis, Georgia Institute of Technology (2005).

Hildreth, Owen James, et al., Effect of Catalyst Shape and Etchant Composition on Etching Direction in Metal-Assisted Chemical Etching of Silicon to Fabricate 3D Nanostructures, ACS Nano, vol. 3, No. 12, Dec. 2009.

Paxton, Walter, F., et al., Motility of Catalytic Nanoparticles through Self-Generated Forces; Chemistry—A European Journal, No. 11, pp. 6462-6470, Jul. 2005.

Zhang, H. M., and Choy, Wallace C. H., Highly Efficient Organic light-Emitting Devices with Surface-Modified Metal Anode by Vandium Pentoxide; J. Phys. D.: Appl. Phys. 41, Feb. 2008.

Zhang, Fan, et al., Quantitative Measurement of Nanoparticle Halo Formation Around Colloidal Microspheres in Binary Mixtures; Langmuir, vol. 24, pp. 6504-6508, May 2008.

Zhang, S. et al.. Evaluation of Adhesion Strength and Toughness of Fluoridated Hydroxyapatite Coatings; Thin Solid Films, No. 516, pp. 6162-5167, Jul. 2007.

Weiss, Sharon, et al.; Electrical and Thermal Modulation of Silicon Photonic Bandgap Microcavities Containing Liquid Crystals; Optics Express, vol. 13, No. 4, pp. 1090-1097, Feb. 2005.

Xiu, Yonghao, et al.; UV and Thermally Stable Superhydrophobic Coatings from Sol-Gel Processing; Journal of Colloid and Interface Science, No. 326, pp. 465-470, Jun. 2008.

Sun, Yugang, et al.; Uniform Silver Nanowires Synthesis by Reducing AgNO3 with Ethylene Glycol in the Presence of Seeds and Poly(Vinyl Pyrrolidone); American Chem. Mater. No. 14, pp. 4736-4745, Oct. 2002.

Sun, Yugang, et al., Shape-Controlled Synthesis of Gold and Silver Nanoparticles; Science No. 298, pp. 2176-2179, Dec. 2002.

Rykaczewski, Konrad, et al.; The Effect of the Geometry and Material Properties of a Carbon Joint Produced by Electron Beam Induced Deposition on the Electrical Resistance of a multiwalled Carbon Nanotube-to-Metal Contact Interface; Nanotechnology, No. 21, pp. 1-12 (Dec. 2009).

Ramm, Peter, et al.; Through-Silicon Via Technologies for Extreme Miniaturized 3D Integrated Wireless Sensor Systems (e-CUBES); IEEE No. 987-1-4244-1911-1, pp. 7-9, 2008.

Peng, Bei, et al.; Measurement of Near-Ultimate Strength for Multiwalled Carbon nanotubes and Irradiation-Induced Crosslinking Improvements; Nature Nanotechnology 3, 626-631 (pp. 1-6) Aug. 2008.

Lee, Chengkuo, et al.; Si Nanophotonics Based Cantilever Sensor; Applied Physics Letters 93, 113113, Sep. 2008.

Chun, Ik Su, et al.; 3D Nanoscale Pattern Formation in Porous Silicon; IEEE, 978-1-55752-859-9, Optical Society of America, 2 Pages, 2008.

Klinke, Christian, et al.; Field-Effect Transistors Assembled from Functionalized Carbon Nanotubes; http://arxiv.org/abs/cond-mat/0611051v1, Nov. 2006.

PCT International Search Report and Written Opinion in co-pending, related PCT Application No. PCT/US2010/029370, mailed Jun. 16, 2010.

* cited by examiner

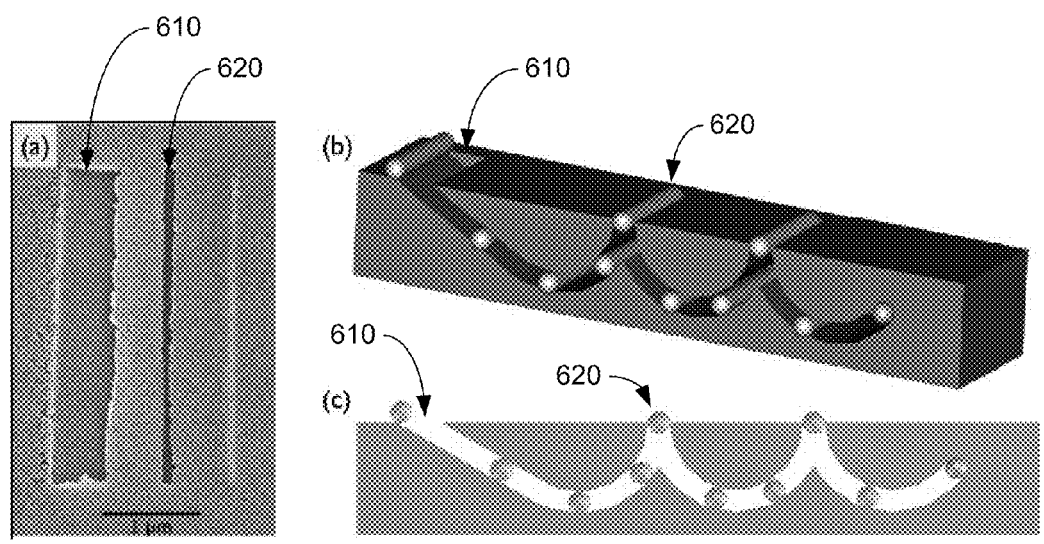
FIGURE 6
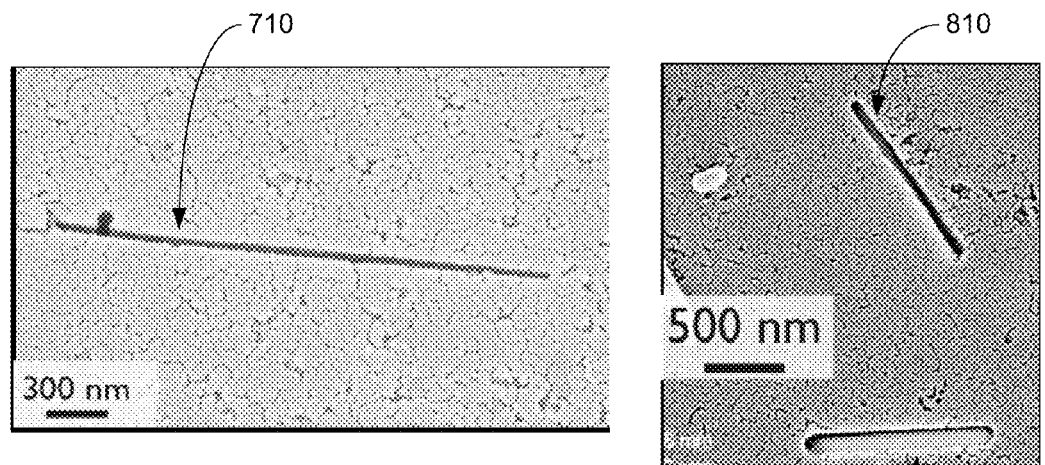
FIGURE 7
FIGURE 8

ABSTRACT# METHODS AND SYSTEMS FOR METAL-ASSISTED CHEMICAL ETCHING OF SUBSTRATES

CROSS REFERENCE TO RELATED APPLICATIONS

This application claims priority to copending U.S. provisional application entitled "METHOD TO ETCH SOPHISTICATED AND CONTROLLABLE SHAPES WITH FEATURES SPANNING THE NANOMETER TO MICROMETER SIZE RANGE INTO SILICON WAFER USING METAL-ASSISTED ETCHING WITH METAL TEMPLATES" having Ser. No. 61/165,265, filed Mar. 31, 2009, which is entirely incorporated herein by reference.

STATEMENT REGARDING FEDERALLY SPONSORED RESEARCH OR DEVELOPMENT

This invention was made with U.S. Government support under agreement no. CMMI-0800849, awarded by the National Science Foundation. The Government has certain rights in this invention.

BACKGROUND

Fabrication on the micron, sub-micron and nano scales are becoming increasingly important to both scientific research and industrial applications such as electronic devices, photovoltaic cells, optoelectronics, and microelectromechanical (MEM) systems. There are a number of emerging technologies such as metamaterials, photonic wave-guides, nano-imprint lithography (NIL), field emission devices, and through silicon via (TSV) that require high resolution and high aspect ratio nanofabrication techniques for good performance. Unfortunately, current nanofabrication techniques, including wet chemical methods utilizing potassium hydroxide (KOH), sodium hydroxide (NaOH), etch stops, and buffered oxide etchs (BOE) or dry chemical methods utilizing such methods as plasma etching, deep reactive ion etching, and ion etching suffer from undercuts, scalloped edges and/or undercuts, crystallographic dependencies and are limited to low aspect ratios on the order of 7:1. Deep reactive ion etching (DRIE) is generally used to create structures with aspect ratios of around 10:1 under general conditions; however the process leaves rough scalloped side walls that can limit device efficiency.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 6-8 illustrate the effect of etching with metal catalyst nanorods during MaCE of FIG. 1 in accordance with embodiments of the disclosure.

DETAILED DESCRIPTION

Figure 1:
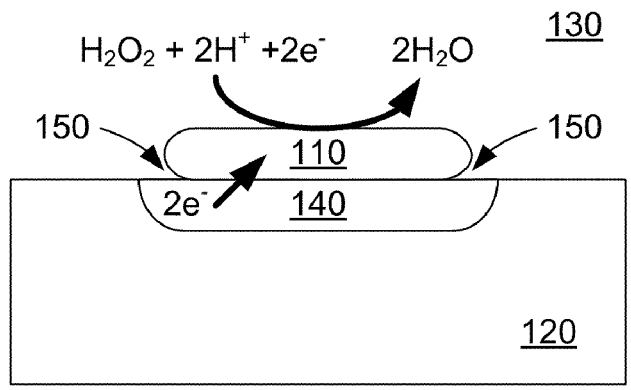
FIG. 1 is a graphical representation of an exemplary metal-assisted chemical etching (MaCE) process in accordance with embodiments of the disclosure.
Figure 1:
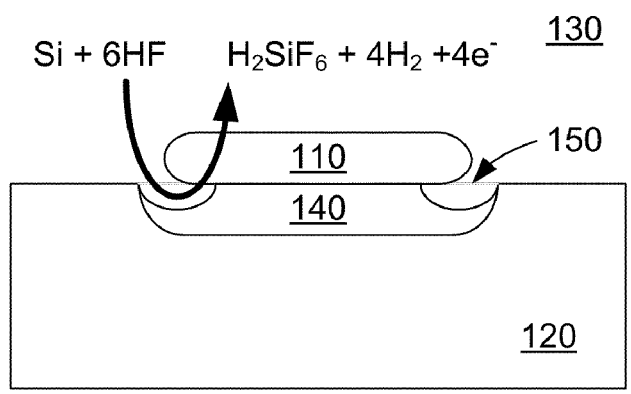
Figure 1:
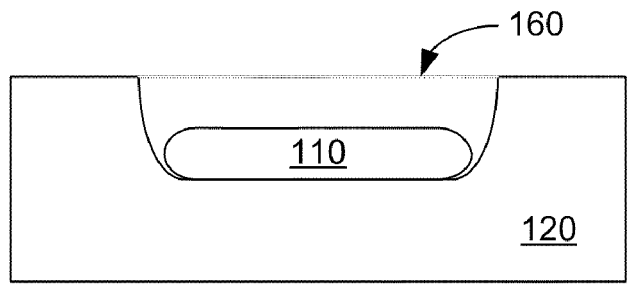

Disclosed herein are various embodiments related to metal-assisted chemical etching of substrates on the micron, sub-micron, and nano scales. Reference will now be made in detail to the description of the embodiments as illustrated in the drawings, wherein like reference numbers indicate like parts throughout the several views.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those skilled in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

As used herein, the following terms have the meanings ascribed to them unless specified otherwise. In this disclosure, "comprises," "comprising," "containing" and "having" and the like can have the meaning ascribed to them in U.S. patent law and can mean "includes," "including," and the like; "consisting essentially of" or "consists essentially" or the like, when applied to methods and compositions encompassed by the present disclosure refers to compositions like those disclosed herein, but which may contain additional structural groups, composition components or method steps (or analogs or derivatives thereof as discussed above). Such additional structural groups, composition components or method steps, etc., however, do not materially affect the basic and novel characteristic(s) of the compositions or methods, compared to those of the corresponding compositions or methods disclosed herein. "Consisting essentially of" or "consists essentially" or the like, when applied to methods and compositions encompassed by the present disclosure have the meaning ascribed in U.S. Patent law and the term is open-ended, allowing for the presence of more than that which is recited so long as basic or novel characteristics of that which is recited is not changed by the presence of more than that which is recited, but excludes prior art embodiments.

Metal-assisted chemical etching (MaCE) is an electroless chemical etching technique that can etch micron (e.g., about 1-1000 μm), sub-micron (e.g., about 0.1-1 μm), and nano-sized (e.g., 0.5-100 nm) features in substrates or wafers with high aspect ratios. MaCE uses a non-spherical metal catalyst deposited onto a substrate to locally increase the dissolution rate of the substrate material in an etchant solution including a fluoride etchant such as hydrofluoric acid (HF) and an oxidizing agent such as hydrogen peroxide ($H_2O_2$). Substrate materials can include silicon (Si), germainium (Ge), arsenic (As), selenium (Se), gallium (Ga), tellurium (Te), polonium (Po), and combinations thereof, as well as mixtures of group III, IV, and V compounds such as Ga—As, Si—C, Ga—N, Si—N, Ga—Si, and Si—As. Substrate materials may also be doped with a dopant such as, but not limited to, boron (B), phosphorous (P), arsenic (As), gallium (Ga). Metal catalysts can include, but are not limited to, gold (Au), silver (Ag), platinum (Pt), tungsten (W), palladium (Pd), copper (Cu), and combinations and/or alloys thereof. Other metal catalysts may also include aluminum (Al), titanium (Ti), Nickel (Ni), iron (Fe), zinc (Zn), cadmium (Cd), indium (In), tin (Sn), antimony (Sb), tellurium (Te), lead (Pb), bismuth (Bi), vanadium (V), chromium (Cr), manganese (Mg), ruthenium (Ru), molybdenum (Mo), and other transition metals. Fluoride etchants also include, but are not limited to, buffered oxide etch (BOE), boron hydrogen fluoride (BHF), or other fluoride complex (e.g., $BF_4^-$, $PF_6^-$, $CF_3SO_3^-$, $AsF_6^-$, and $SbF_6^-$). Other oxidizing agents that may be used include, but are not limited to, $K_2MnO_4$ and $FeNO_3$. The composition of the etchant solution (ρ) may be described in terms of the concentrations of fluoride etchant and oxidizing agent as, e.g., $\rho=[H]/([HF]+[H_2O_2])$, where the water concentration $[H_2O]$ is kept constant. The composition of the etchant solution (ρ) may be in the range of about 99% to about 1%, about 90% to about 40%, and about 90% to about 60%. Examples of etchant solution compositions that were utilized to produce some of the experimental results discussed below are provided in TABLE 1, where ρ is with volumes used and molarities of HF (Aldrich, 49%), $H_2O_2$ (Aldrich, 30%), and $H_2O$ (distilled).

TABLE 1

Composition of etchant solution (ρ)

| | volume (mL) | | | molarity (M) | | |
|---|---|---|---|---|---|---|
| ρ | HF (49%) | $H_2O_2$ (30%) | $H_2O$ | HF | $H_2O_2$ | $H_2O$ |
| 90% | 4.0 | 1.2 | 1.7 | 16.7 | 1.8 | 36.6 |
| 60% | 4.0 | 7.2 | 1.1 | 9.4 | 6.2 | 36.8 |
| 40% | 4.0 | 15.6 | 0.0 | 5.9 | 8.4 | 36.6 |

For example, during MaCE of silicon, the etchant solution intimately contacts with both the metal catalyst for reduction of the oxidizing agent and the silicon for silicon dissolution by creating a localized galvanic cell across the metal catalyst. The MaCE process is independent of crystal orientation under most conditions and may be used to create a wide variety of hole profiles, morphologies and paths. However, under some specific etchant and catalyst compositions, the crystallographic orientation dependent effects can be accessed to control etching direction along specific crystallographic planes. The specific etchant and catalyst composition may depend upon the material composition of the substrate, its dopant amount and type, the crystal orientation of the substrate, temperature, etc. The primary mechanism behind selecting specific crystal planes as etching directions is the small differences in the kinetic reaction rate for the dissolution of the semiconductor substrate along those planes. For example, a p-type silicon single crystal silicon wafer can show a difference in the critical current density, $J_{ps}$ (that separates the porous silicon from polished silicon regimes), of up to about 10 mA/cm² between the (100) and (111) planes in 5% HF and a voltage shift of over 1 V. Since MaCE is an electrochemical reaction, it is possible to shift where and by how much the $J_{ps}$ shifts by controlling the substrate dopant type, etchant composition, catalyst composition, etc., and ensuring that the etching occurs in a regime that is either sensitive to crystal orientation or insensitive to crystal orientation. The hole profile is the shape of the hole perpendicular to the etching direction; hole morphology is used to distinguish between conical holes and tight fitting holes, and hole or etching path is the path taken by the metal catalyst as it etches into the substrate.

With reference to FIG. 1, shown is a graphical representation of an exemplary MaCE process in accordance with embodiments of the disclosure. In the embodiment of FIG. 1, a metal catalyst 110 of silver (Ag) is deposited onto the silicon (Si) substrate 120. When exposed to an etchant solution 130 of hydrofluoric acid (HF) and hydrogen peroxide ($H_2O_2$), the MaCE involves a local coupling of redox reactions including:

Cathode (Metal Catalyst):

$$H_2O_2 + 2H^+ \rightarrow 2H_2O + 2h^+ \quad (1)$$

$$2H^+ \rightarrow H_2 + 2(h^+) \quad (2)$$

Anode (Si):

$$Si + 6HF + nh^+ \rightarrow H_2SiF_6 + nH^+ + \frac{1}{2}[4-n]H_2 \quad (3)$$

Overall Reaction:

$$Si + 6HF + \frac{1}{2}nH_2O_2 H_2SiF_6 + nH_2O + \frac{1}{2}[4-n]H_2 \quad (4)$$

where $h^+$ are holes and n denotes the different reactions that can occur at different etching regimes which may be controlled through the composition of the etchant solution ($\rho$).

The etching process begins as the oxidizing agent ($H_2O_2$) is catalytically reduced at the metal catalyst 110, creating a local cathode that injects holes (h+) into the valence band of the Si, leading to a hole (h+) rich region 140 of the silicon (Si*) substrate 120 surrounding the Ag catalyst 110. Holes (h+) are consumed at the fluoride etchant/silicon substrate (HF/Si*) interface 150 in the oxidation of $Si^0$ to $Si^{4+}$ producing soluble $SiF_6$ and $H_2SiF_6$. As the hole rich region 140 of the silicon substrate 120 dissolves, the metal catalyst 110 is lowered or falls into the dissolved region. The etching process continues as the metal catalyst 110 travels into the region 160 where the silicon around and beneath the metal catalyst 110 has dissolved. Dependent on etchant composition, dissolution of the substrate can be confined to a region in close proximity to the metal catalyst 110 (creating a high aspect ratio nearly vertical protrusion into the substrate) or can take place over a wide region around the metal catalyst 110 (creating conical holes or shallow craters in the substrate).

Figure 2A:
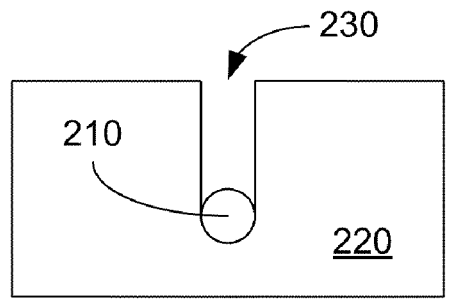
FIG. 2A-2C are graphical representations of etching morphologies produced by varying the composition of the etchant solution of a MaCE process of FIG. 1 in accordance with embodiments of the disclosure.
Figure 2B:
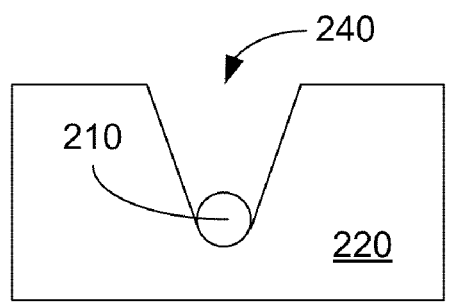
Figure 2C:
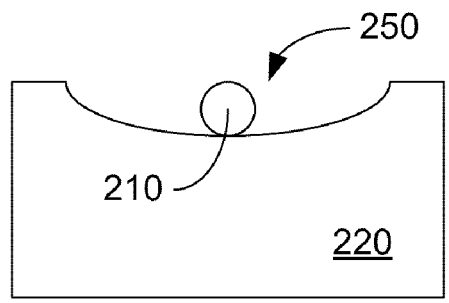

Varying the composition of the etchant solution can greatly change the resulting etched morphology with substrate dissolution limited to regions within a few nanometers (e.g., about 2-8 nm) or less of the metal catalyst 110 or taking place tens of nanometers (e.g., about 10-90 nm) or more from the metal catalyst 110. The etching regimes and their relationship to both n and the etchant solution composition, $\rho$, are illustrated in FIGS. 2A-2C. With respect to FIG. 2A, at high $\rho$ (e.g., greater than about 70), n=2 and the hole or channel 230 formed in the substrate 220 by the metal catalyst 210 tightly conforms to the shape and size of the catalyst particle.

As the concentration of the fluoride etchant (e.g., [HF]) is lowered relative to the oxidizing agent (e.g., [$H_2O_2$]), $\rho$ decreases (e.g., in the range of about 20 to about 60) and the hole ($h^+$) injection increases causing the holes (h+) to travel farther away from the metal catalyst 210 before being consumed at the exemplary fluoride etchant/silicon substrate (HF/Si*) interface. As depicted in FIG. 2B; conical holes 240 are formed under these conditions. For this case, n increases to 3 and $\frac{1}{2}H_2$ molecule is created for every dissolved silicon atom.

Referring now to FIG. 2C, at even lower fluoride etchant concentrations [HF] (e.g., at $\rho$ less than about 10) n=4. At this composition of the etchant solution, no net hydrogen is produced and the hole (h+) injection current is high enough that the silicon dissolution takes place hundreds of nanometers away form the metal catalyst 210 and only shallow craters 250 are formed with significant surface etching. As the etchant solution composition ($\rho$) is decreased, the hole (h+) injection current becomes higher than local consumption, allowing the holes (h+) to travel farther and change the morphology of the etched substrate material. It should be noted that the described etchant solution compositions may vary with different combinations of catalysts, fluoride etchants, and oxidizing agents. For example, platinum (Pt) catalytically reduces $H_2O_2$ at a higher rate than gold (Au), which results in a higher hole ($h^+$) injection current into a silicon substrate and wider holes than Au catalysts at the same etchant composition, $\rho$. Palladium exhibits even higher catalytic activity and requires a much higher HF concentration (higher $\rho$) to achieve narrow etched holes. On the other end, catalysts such as W exhibit low catalytic activity for the reduction of $H_2O_2$ and may be also partially dissolved in the etchant. This yields a lower etching rate for the same etchant composition and can be used to create holes that controllably narrow over their depth.

Using these methods, feature resolutions down to 5 nm and/or aspect ratios of less than 1:1, at or greater than 1:1, greater than 10:1, greater than 50:1, greater than 75:1, greater than 100:1, greater than 150:1, greater than 200:1, greater than 250:1, and higher (e.g., 10,000:1) may be achieved. Additionally, unlike other etching techniques where a pattern of material remains on the top surface acting as a mask, in the MaCE process the metal catalyst 110 moves into the substrate 120 as the substrate material around and beneath the metal catalyst 110 dissolves. Because the metal catalyst 110 can travel in three dimensions while continuing to etch, it is possible to create three-dimensional (3D) patterns in the silicon with straight, curved, helical, and random etching paths as just some examples. While the etching solution composition may control the etching path, the shape of the metal catalyst 110 may also affect the etching path.

Metal catalysts can include discrete nanoparticles, discontinuous thin films, and more complicated structures that are patterned on the substrate. Nanoparticles can be about 1 nm to about 500 µm in length and about 0.5 nm to about 500 nm in diameter. For example, discrete nanoparticles that may be positioned on the substrate include non-spherical particles such as, but not limited to, nanorods, nano-sized plates, donuts with center openings, coordinated colloids, treated or distorted nanoparticles, and cubes. Other materials can also be coated with catalyst materials including, but not limited to, nanowires, nanotubes, DNA, polymers, and oxides. Patterned structures can include, but are not limited to, star patterns, square, rectangular, or grid patterns, L or V shaped brackets, embedded coaxial patterns, and more complex combinations of patterns such as a circular plate with square cutouts. Discontinuous thin films and patterned structures can cover areas of, e.g., about 0.25 $nm^2$ to about 900 $\mu m^2$ (or larger). Patterned structures may include lines and/or features with a width and/or thickness of about 0.5 nm to about 500 nm. These structures may be patterned on the substrate using methods such as, but not limited to, photolithography with metallization and lift-off, electron beam lithography (EBL), nano-imprinting, nano-imprint lithography (NIL), nano-burning lithography, photo-curing lithography, electron beam chemical vapor deposition (EBCVD), and focus ion beam (FIB) milling/deposition. To provide further details, various embodiments are discussed below.

Figure 3:
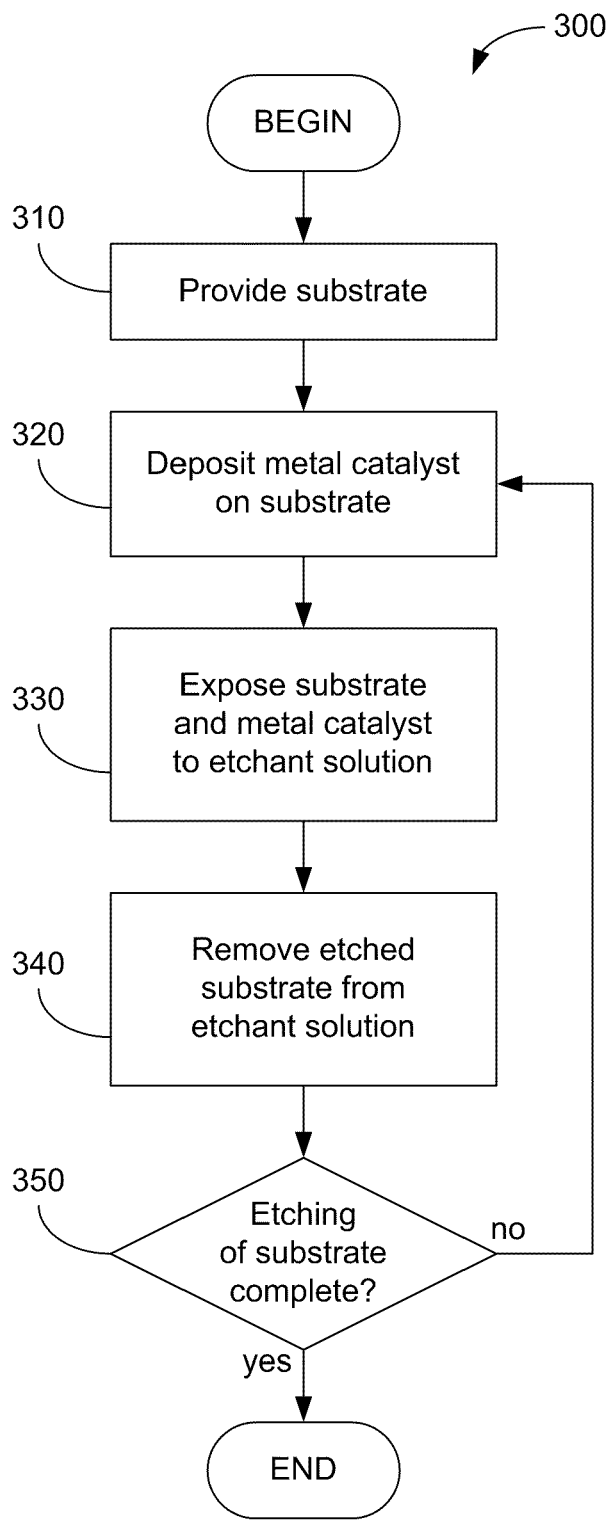
FIG. 3 is a flow chart illustrating steps of an exemplary MaCE process of FIG. 1 according to various embodiments of the disclosure.

Referring now to FIG. 3, shown is a flow chart 300 illustrating the metal-assisted chemical etching of a substrate according to various embodiments of the disclosure. Beginning with block 310, a substrate is provided. The substrate material may be silicon or other appropriate material as previously discussed. Metal catalyst is then deposited on the substrate in block 320. In some embodiments, one or more metal catalyst nanoparticles are positioned on the surface of the substrate. Non-spherical nanoparticles may be positioned to provide for simple or complex etching patterns. In other embodiments, the metal catalyst may be patterned on the surface of the substrate to form one or more patterned structures. Alternatively, a plurality of metal catalysts may be deposited on the substrate surface. The use of different metals may allow for etching to different depths or along different paths during the same MaCE process.

Figure 4A:
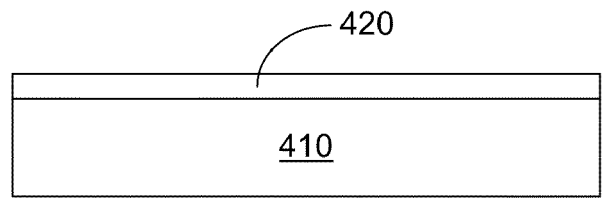
FIGS. 4A-4G are graphical representations of an exemplary patterning of a metal catalyst on a substrate in accordance with embodiments of the disclosure.
Figure 4B:
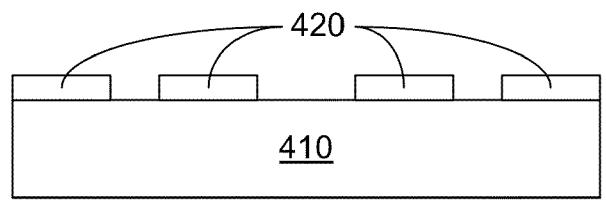
Figure 4C:
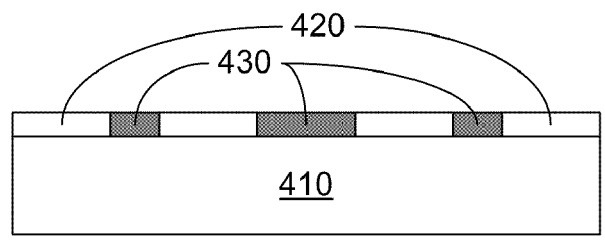
Figure 4D:
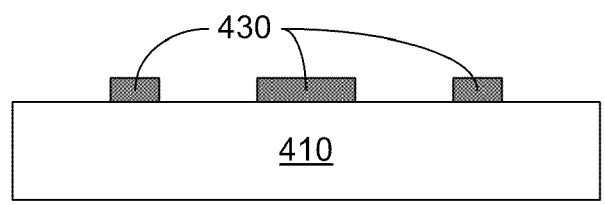

FIGS. 4A-4G are graphical representations of an exemplary patterning of a metal catalyst on a substrate. To begin, a substrate 410 (e.g., silicon) is provided and a patternable resist layer 420 is applied to a surface of the substrate 410 in FIG. 4A. Examples of resists can include, but are not limited to, photoresist polymers which decompose or polymerize under application of light, oxides, nitrides, sulfides, electron resists, nanoimprint lithography resists, chemical resists, colloids and self-assembled colloids, self-assembled metals and metalloids. The resist layer 420 may then be patterned as illustrated in FIG. 4B to form a mold for the metal catalyst pattern. A metal 430 is then deposited in the mold formed in the resist layer 420 (FIG. 4C) using a suitable deposition process. Deposition processes include, but are not limited to, electron beam evaporation, Direct Current (DC) sputtering, filament evaporation, wet chemical deposition with or without a seed layer, in-situ wet chemical deposition with or without a seed layer, reactive ion sputtering, metal-organic chemical vapor deposition (MOCVD), organometallic chemical vapor deposition, atomic layer deposition (ALD), laser evaporation, radio frequency ion etching and radio frequency reactive sputtering. Some materials and methods may utilized multiple metal layers to enhance feature resolution and resist lift-off success. An example is the use of titanium as an adhesion layer between silicon and gold where a thin layer of titanium is deposited on the silicon prior to gold deposition.

Figure 4E:
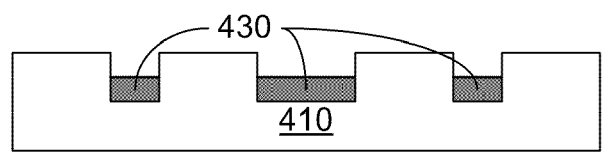

The resist layer 420 may then be removed (FIG. 4D), leaving the patterned metal catalyst 430 on the substrate 410. In some embodiments, patterning of metal catalysts may include patterning and removal of a plurality of resist layers to form metal catalysts of different dimensions and/or different materials or combinations of materials. The patterned metal catalyst 430 may then etch into the substrate 410 during the MaCE process, e.g., as depicted in FIG. 4E.

Figure 4F:
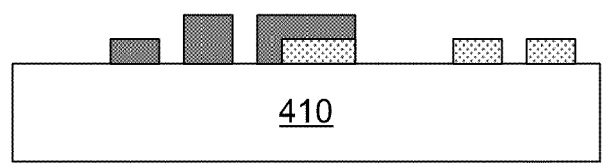
Figure 4G:
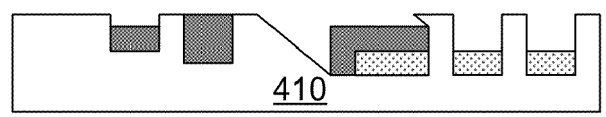

Alternatively, a plurality of metals may be deposited with only a single resist layer of controllable shape by tilting the substrate during deposition of the metal. For example, as illustrated in FIG. 4F, two metals may be deposited on the substrate to form metal catalysts of varying dimensions, patterns, and combinations of metals. The combination of metals may etch into the substrate 410 at different rates and/or directions during the MaCE process, e.g., as depicted in FIG. 4G. In some embodiments, different metals may produce rotation and/or spiraling of metal catalysts.

Referring back to FIG. 3, after the metal catalyst is deposited in block 320, the substrate and metal catalyst are then exposed to an etchant solution in block 330. The exposure time may be limited to control the etching depth and/or movement of the metal catalyst through the substrate. Controlling or varying the composition of the etchant solution (ρ) before and/or during the MaCE process may allow for control of the etching width and/or direction. At the appropriate time, the etched substrate is removed from the etchant solution and treated to neutralize any further etching. In some embodiments, the substrate is diced to produce a plurality of substrate portions or chips.

Multiple levels of etching may be provided by performing additional etching iterations. For example, a first metal catalyst particle or pattern may be deposited on the substrate surface (block 320) and exposed to a first etchant solution (block 330). At a predefined time, the substrate and first metal catalyst is removed (block 340). If an additional etching is to be performed (block 350), then a second metal catalyst pattern may be deposited on the substrate surface (block 320). The substrate with the first and second metal catalysts may then be exposed to either the first etchant solution or a second etchant solution (block 330) for further etching. In some embodiments, some or all of the first catalyst may be removed, e.g., by using aqua regia. The etching iterations may be repeated to provide multidimensional etching of the substrate.

During the MaCE process, electrophoretic forces may be developed within the metal catalyst. As illustrated in FIG. 1, electrons are removed from the metal catalyst 110 as the oxidizing agent is catalytically reduced. As holes (h+) are consumed at the fluoride etchant/substrate interface 150 during oxidation of the substrate material (e.g., silicon), an electric field is developed within the metal catalyst 110. Symmetry of the electric field may vary depending on local conditions such as concentration fluctuations and uneven etching of the substrate material. If the oxidation is not evenly distributed around the metal catalyst 110, the force produced by the electric field may be directed in a direction that is not perpendicular to the substrate surface.

Figure 5A:
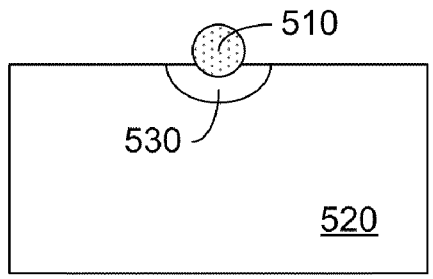
FIGS. 5A-5E are graphical illustrations of an exemplary MaCE process of FIG. 1 for etching a substrate along a three-dimensional path in accordance with embodiments of the disclosure.
Figure 5B:
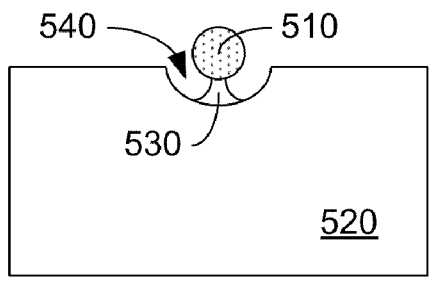
Figure 5C:
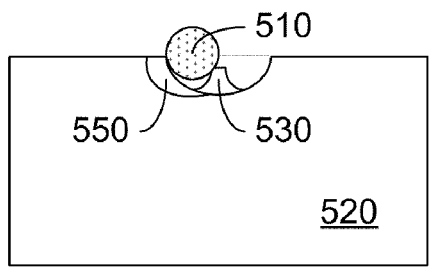
Figure 5D:
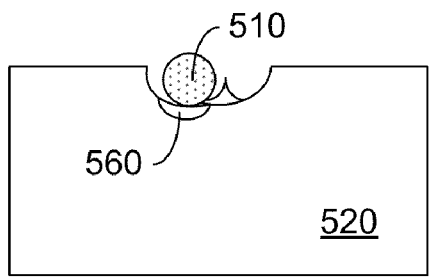
Figure 5E:
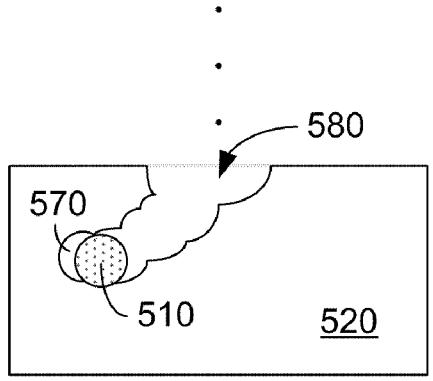

Referring now to FIGS. 5A-5E, shown are graphical illustrations of an exemplary MaCE process etching a substrate along a three-dimensional path. Initially, a hole rich area 530 is formed in an exemplary silicon substrate 520 under a metal catalyst nanorod 510 in FIG. 5A. As the hole ($h^+$) rich area 530 is consumed at the fluoride etchant/silicon substrate interface 540, a channel is formed in the silicon substrate 520 of FIG. 5B. Eventually, the metal catalyst nanorod 510 falls into the channel and contacts the silicon substrate 520 to begin forming a new hole rich area 550 in FIG. 5C. As the new hole rich area 550 is consumed, the metal catalyst nanorod 510 continues to move into the silicon substrate 520 as illustrated in FIG. 5D. As the metal catalyst nanorod 510 continues to move within the substrate 520, the MaCE process produces an electric field within the metal catalyst nanorod 510 that can cause the metal catalyst nanorod 510 to travel through the substrate 520 in three-dimensions. Hole rich areas (e.g., 560 and 570) continue to form and be etched away as the metal catalyst nanorod 510 passes through the silicon substrate 520 to form the channel 580 in FIG. 5E. As the cycle continues, the force from the electric field may direct the metal catalyst nanorod 510 horizontally through the substrate 520 and/or back out of the top surface of the substrate 520 similar to FIG. 6. In some embodiments, controlling or varying the composition of the etchant solution (ρ) may allow for control of the etching direction.

The metal catalysts may also include combinations of metal catalysts. For example, the nanoparticles may be formed with two metal catalysts that react with the etchant solution at different rates. When exposed to an etchant solution, the variation in the etching rate may cause the metal catalyst to move or rotate in a desired direction. Alternatively, the metal catalyst particles may also include a capping agent or coating such as, but not limited to, poly (vinyl pyrrolidone) (PVP) during synthesis. Coating a portion of a metal catalyst particle may retard the MaCE reactions along the coated portion, which may cause the metal catalyst to move in a desired direction.

In some embodiments, the metal catalyst may be combined with a magnetically influenced material such as, but not limited to, iron (Fe), cobalt (Co), and nickel (Ni), along with alloys, composites, oxides, and/or sulfides such as Hematite, Aaruite, Wairauite, NiOFe2O3, CoOFe2O3, BaO-6Fe2O3, MnAl, CoPt, FePt. For example, a nickel nanorod may be coated with gold to form a magnetically controllable metal catalyst particle. Application of a magnetic field during the MaCE process can be controlled to direct the magnetically controllable metal catalyst particle within the substrate. Orientation and strength of the magnetic field may be varied to affect how the magnetically controllable metal catalyst particle contacts the substrate, thereby controlling the direction of etching. In addition, by controlling the orientation of the magnetically controllable metal catalyst particle, the channel geometry (e.g., width, height, radius, etc.) may be varied during the MaCE. For example, by moving a magnetically controllable metal catalyst nanorod along its axis, a small channel may be formed, while moving the magnetically controllable metal catalyst nanorod perpendicular to its axis forms a wide channel.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include ±1%, ±2%, ±3%, ±4%, ±5%, ±6%, ±7%, ±8%, ±9%, or ±10%, or more of the numerical value(s) being modified. In addition, the phrase "about 'x' to 'y'" includes "about 'x' to about 'y'".

EXPERIMENTAL RESULTS

Wet chemical synthesis was used to form Ag nanorods and Ag nanodonuts. All samples were prepared on 100 mm single side polished, p-type (1-100 Ω-cm) single-crystal (100) silicon wafers. The silicon wafers were cleaned at room temperature for 20 min using a piranha solution of 4:1 by volume of $H_2SO_4$ (95-98 wt %) and $H_2O_2$ (30 wt %). The silicon wafers were then rinsed with distilled $H_2O$ three times followed by a 3 minute immersion in a dilute of 1:100 HF (Alrich, 49 wt %) and rinsed three more times with distilled $H_2O$ then dried with compressed air. For Ag nanorod samples, the silicon wafer was cleaved into approximately 1 cm×6 cm pieces prior to cleaning.

The Ag nanorods were synthesized using a slightly modified ethylene glycol method described by "Crystalline silver nanowires by soft solution processing" by Sun, Y.; Gates, B.; Mayers, B.; and Xia, Y. (Nano Letters, February 2002, v. 2, pp. 165-168) with $KAuCl_4$ used as the seed solution instead of $PtCl_2$. The Ag nanorods were fabricated by reducing $AgNO_3$ in a solution of ethylene glycol using poly(vinyl pyrrolidone) (PVP) as the capping agent. Twenty milliliters of ethylene glycol (BDA 99%) was heated to 160° C. in a 100 mL three-port round-bottom flask in a silicon bath with a 1 m water cooled condensation column attached to the center port. A 25.4 mm magnetic stir bar was used to stir the solution at 500 rpm. A 0.3 mM solution of $KAuCl_4$ (Aldrich 99.995%) was made by dissolving 0.5 mg of $KAuCl_4$ in 2 mL of ethylene glycol and then adding it dropwise to the heated ethylene glycol. After approximately 4 min, a 20 mL, 0.59 M ethylene glycol solution of $AgNO_3$ (0.200 g, Aldrich, 99+%) and 10 mL of ethylene glycol solution of poly(vinyl pyrrolidone) (PVP, 0.550 g, Aldrich, $M_w$ of approximately 29,000) was added dropwise to the ethylene glycol containing gold seeds.

This reaction was kept at temperatures between 160 and 165° C. for approximately 60 min. The solution was cooled to room temperature, diluted 2:1 with ethanol (VWR, denatured), and then centrifuged at 5000 rpm for 30 min to remove the ethylene glycol and excess PVP. The supernatant was removed using a plastic pipette, and the remaining Ag nanorod precipitate was diluted using ethanol and dispersed by sonication for 3 minutes. This process was repeated at least six times until the supernatant remained clear with centrifuge speeds ranging from 2000 to 5000 rpm. The synthesized and centrifuged Ag nanorods are then diluted with ethanol to form a light, slightly colored solution and dispersed onto a cleaved piece of cleaned silicon wafer using a 2 mL pipette with 1-2 drops of solution per $cm^2$ of silicon such that the solution formed a thin film that did not break apart as the ethanol evaporated off the silicon wafer at room temperature. Once dry, the samples were placed into a UV & Ozone Dry Stripper (Samco, model UV-1, 0.5 mL/min $O_2$) for 5 to 8 minutes. Depending on position in the UV & ozone stripper, time, and particle size, the PVP capping agent was completely or partially removed without damaging the Ag nanorods. Ag nanorods with the PVP removed participated in MaCE process.

Metal catalyst nanorods may produce straight and cycloid channels. The widths and lengths of the channels fall within the diameter and length distributions for the post-UV & ozone-treated Ag nanorods. With reference to FIG. 6, shown is a scanning electron microscope (SEM) image along with 2-D and 3-D schematic illustrations of a cycloid path etched by a metal catalyst nanorod. FIG. 6(a) is a thermally assisted field emission SEM image showing a top-down view of the silicon wafer after etching with an Ag nanorod. The term "cycloid" is used to indicate that the Ag nanorod etched below the silicon surface and then changed direction to etch through to the top surface and reemerge some distance away as illustrated in 3D and 2D in FIGS. 6(b) and 6(c), respectively. As depicted in FIG. 6, the Ag nanorod etched into the surface at a slight angle (610), changed direction upward until it penetrated the top surface (620) and then etched downward again to form an inverted wedge (A) shape until returning toward the top surface. The Ag nanorod can be seen just below the silicon surface on the right of FIG. 6(a).

The UV & ozone-treated Ag nanorod catalysts produced both cycloid and straight channels in an etchant solution composition of ρ=90. Variations in the composition of the etching solution can affect the channel width and etching direction. The width of the etched channels ranged from about 25 nm to about 200 nm, and length ranged between about 500 nm to about 2.5 μm. In other embodiments, nanorod widths (and thus channel widths) can be in the range of about 5 nm to about 300 nm, about 5 nm to about 150 nm, and about 10 nm to about 1000 nm. Referring to FIG. 7, shown is a straight channel 710 having a width of 28±3 nm and a length of 2.5 μm. Variations in the composition of the etching solution (ρ) can affect the channel width and etching direction. For example, different etching solution composition can produce resolutions down to about ±3 nm, about ±5 nm, and about ±10 nm.

In addition, it has been observed that there is an inverse relationship between the diameter of the metal catalyst particle and the etching rate. For example, MaCE was simultaneously performed on nanorod catalysts having the same length of 1.1 μm and respective diameters of 60 nm and 110 nm. As shown in FIG. 8, the 60 nm diameter nanorod 810 etched a straight channel well below the surface of the silicon wafer, while the larger 110 nm diameter nanorod 820 has etched less than 100 nm below the surface.

Ag nanodonuts were also synthesized using a combination of UV-ozone, plasma, and heat to transform the particles into a rough donut shape. The same solution-based method as the Ag nanorods described above was used with some modifications. The reaction was conducted at 170° C. instead of 160° C., and then the solution was separated and cleaned via centrifugation using the same conditions before being stored in an ethanol solution for 1 month in the dark before UV-ozone cleaning. The particles were then diluted using ethanol and dispersed onto a cleaned silicon wafer using a plastic pipette and then placed into a UV & Ozone Dry Stripper (Samco, model UV-1, 0.5 mL/min $O_2$) for 5 to 7.5 minutes.

Figure 9:
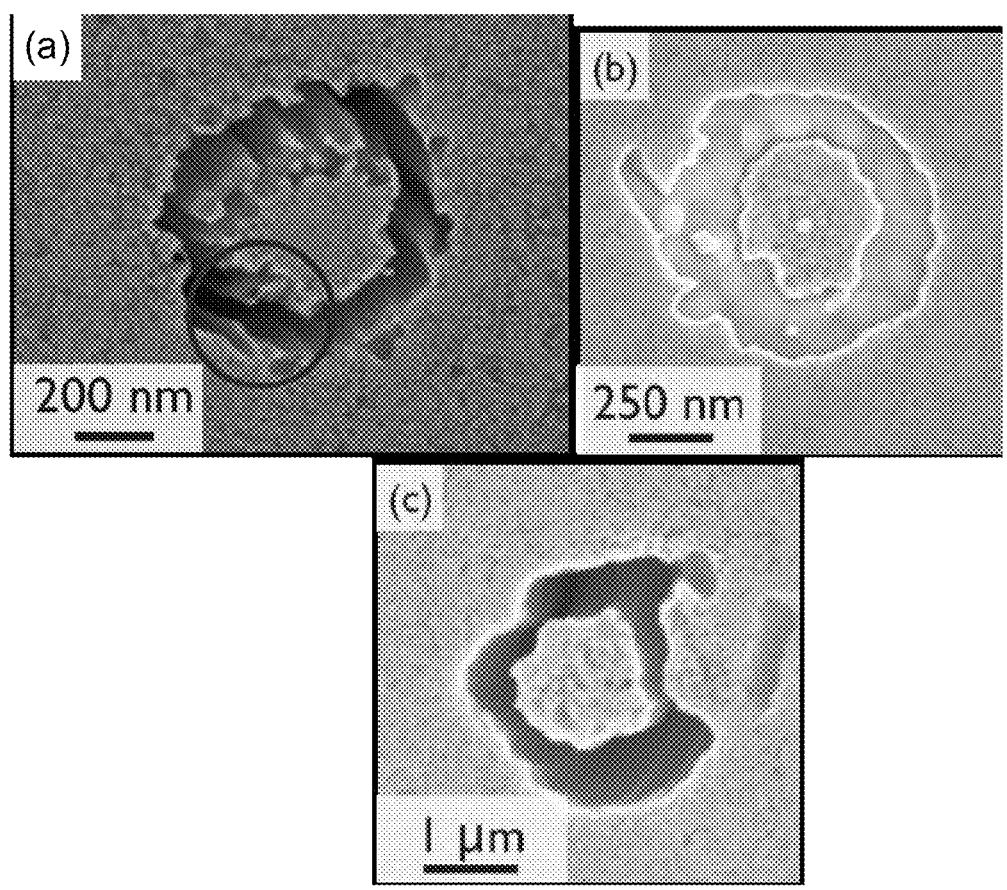
FIG. 9 illustrates the effect of etching with metal catalyst nanodonuts during MaCE of FIG. 1 in accordance with embodiments of the disclosure.

Depending on position in the UV-ozone stripper, time, and particle size, a portion of the sub-micrometer Ag particles distorted to form Ag nanodonuts. This process also removed any PVP capping agent and cleaned the catalyst for MaCE. PVP removal using UV-ozone was found to be dependent on position and time within the UV-ozone stripper. The nanodonuts were etched at an etching solution composition of $\rho=90$ for 30 seconds and 10 minutes. FIG. 9(a) illustrates a circular channel etched by a nanodonut. The channel has a width of about 10 nm with a resolution of about ±5 nm. FIGS. 9(b) and 9(c) show exemplary sub-micrometer Ag nanodonuts after 30 seconds and 10 minutes of etching. The etched profile conforms to within the SEM resolution limit of 10 nm. Notice that the etching path is almost perpendicular to the surface with some slight rotation about the Z-axis. As can be seen in FIGS. 9(a)-9(c), fabrication of the metal catalysts did not produce smooth nanodonuts.

For certain shapes, such as Ag nanorods, the electrophoretic forces loosely confine the metal catalyst particle along certain planes and directions in a manner that is akin to removing degrees of translational and rotational freedom. For example, under $\rho=90$, spherical nanoparticles will etch random paths through the silicon, capable of moving with a full six degrees of freedom (DoF), while Ag nanorods are predominately confined to a plane perpendicular to the longitudinal axis, giving them three DoF: two translational, one rotational. In contrast, Ag nanodonuts exhibit two DoF, capable of etching perpendicular to the substrate with some slight rotation about an axis perpendicular to the substrate surface. These changes in DoF may be due to changes in the electric field and electrophoretic motion caused by the change in catalyst shape. Other factors such as catalyst composition, capping agents, organic material or patterns, etchant solution concentration and concentration gradients, reactant and product diffusion and diffusion paths, hydronium ion migration, hole diffusion within different silicon substrates, and Brownian motion may also affect the etching direction along with external electric or magnetic fields. Bulk fluid velocity, such as a stirred versus non-stirred solution, may also effect etching direction, rate and resolution.

The etched paths made using Ag nanorod and nanodonut catalysts showed that catalyst shape also directly influences the etching direction. To study more complex shapes, we used EBL to fabricate Ti/Au nanostructures with a 10 nm base adhesion layer of titanium (Ti) followed by 50 nm of Au catalyst consisting of discs, lines, "dog-bone" shapes (FIGS. 10(a)-10(c)), squares (FIG. 12), stars (FIG. 14), grids with line widths ranging from about 25 nm to about 200 nm and lengths from about 200 nm to about 5 μm (FIGS. 10(d) & 10(e)), square or L-shaped brackets (FIG. 10(f)), and concentric circles or "C" shapes (FIG. 10(g)). For the EBL-patterned Au samples, the silicon wafer was cleaned prior to patterning, patterned using the EBL, and then cleaved into approximately 1 cm×1 cm samples. All EBL samples were etched for 40 minutes in an etchant solution concentration of $\rho=40$ and 90. Initial tests indicated that the Ti adhesion layer lowered the etching rate of the metal catalysts. Results with the EBL-patterned metal catalysts also indicated that both the shape of the metal catalyst and the ratio of catalyst line width versus thickness directly influence etching direction.

FIGS. 10(a)-10(c) are SEM images of silicon etched with dog-bone shaped gold (Au) catalysts that were patterned with EBL. FIG. 10(a) shows etchings created using MaCE with an etchant solution composition of $\rho=40$. The smooth walls and high feature resolution capabilities of MaCE are demonstrated by the channels produced by the Au dog-bone shaped nanostructures. The channels, which were produced by the 200 nm wide, 1.5 μm long Au dog-bone shaped nanostructure, shows sharp corners and smooth sidewalls over its entire length with feature resolutions on the order of 10 nm or less. The rougher edge, in the Y-axis direction, shows small pores in the silicon indicating increased silicon etching on the leading edge of the metal catalyst. Because the etching process is regulated by the local availability of holes ($h^+$), these results suggest that the leading edges either experience a higher hole ($h^+$) injection current or, due to the wedge geometry, holes ($h^+$) become confined within this narrow region, leading to a porous structure.

FIG. 10(b) shows three channels formed by Au dog-bone shaped nanostructures that were 50 nm wide and ranging from 500 nm to 1.5 μm long. The channels were etched to depths of greater than 200 nm, giving these features an aspect ratio of about 4:1. The higher magnification in FIG. 10(c) shown the 50 nm wide features etched into the silicon. The higher magnification image once again shows relatively smooth walls.

A comparison of the importance of cross-section shape, profile shape, and line width to thickness ratio on etching direction may demonstrated by the etching path of Au nanorods, Au nanolines, and Au dog-bone shaped nanostructures. The change from the circular cross section of Ag nanorods to the rectangular cross section of Au nanolines dramatically changed the etching paths from cycloid-like paths to straighter channels. In addition, the Au nanolines with 200 and 100 nm line widths appeared to remain closer to the surface of the silicon substrate and slice just below the surface, while 50 and 25 nm line widths appeared to penetrate farther into the silicon. Etchant solution composition also changed the etching paths of the Au nanolines and can be used as a method to control the etching path. An etchant solution concentration of $\rho=40$ created straighter etchings while an etchant solution concentration of $\rho=90$ showed more distortion, bending, and even tumbling. Changes in the etchant solution composition may affect both the etching rate of the silicon and the electric field strength across the catalyst particle, which may affect the electrophoresis movement of metal catalysts during the MaCE process.

The small addition of 400 nm long end caps to the Au nanolines to create the Au dog-bone shaped nanostructures completely eliminated the cycloid-like etching seen with Ag nanorods. The Au dog-bone shaped nanostructures do not change etching direction, even if the metal catalyst is bent. As such, because the Au dog-bone shaped nanostructures do not change direction once etching starts, the metal catalyst is confined to a ½ DoF along the initial direction of motion into the bulk silicon. The cycloid etching path can be recovered and controlled by changing the catalyst composition and/or the ratio between the line width and thickness or height of the catalyst along with the length of the end-caps. The sloping angle of the etched hole can be controlled by the etchant composition and/or ratio between the line width to catalyst thickness.

The metal catalyst may also be formed into more complicated patterns such as, but not limited to, squares, grids, L-shaped brackets, concentric circles, and stars. FIGS. 10(d) and 10(e) are SEM images of grid patterns etched by an Au grid with 50 nm wide lines after 10 and 40 minutes of MaCE with an etchant solution concentration of ρ=90, respectively. It is clear from the image of FIG. 10(d) that, at 10 minutes, the etched shape tightly conforms to the shape of the Au catalyst and from the image of FIG. 10(e), that at 40 minutes, the etched shape continues to show good feature resolution with relatively smooth walls. Some minor surface etching is visible in the image of FIG. 10(e). FIG. 10(f) is a SEM image of a silicon substrate etched by an Au L-shaped (or square) bracket having 100 nm wide lines using an etchant solution concentration of ρ=90.

Figures 10, 11:
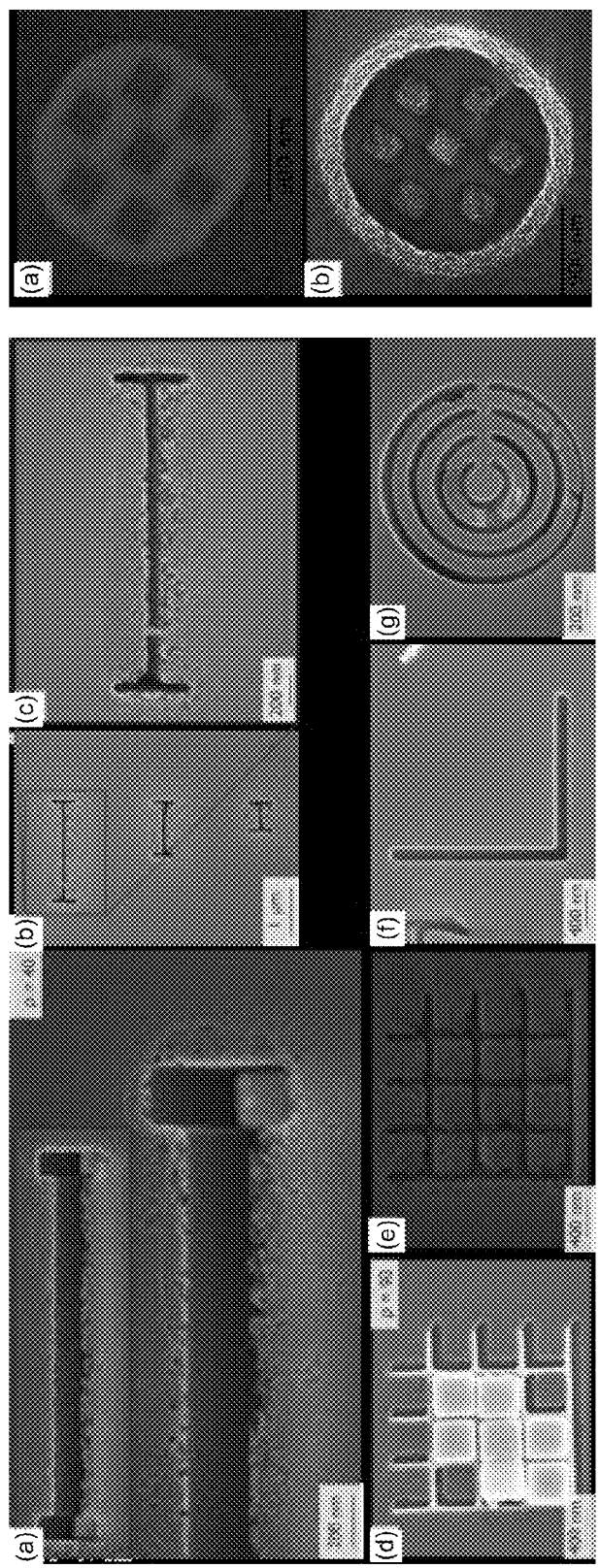
FIGS. 10-14 illustrate the effect of etching with complicated metal catalysts patterned on a substrate during MaCE of FIG. 1 in accordance with embodiments of the disclosure.

More complicated structures may also be produced using MaCE such as concentric circles or "C" shapes. FIG. 10(g) is a SEM image of a silicon substrate etched by an Au catalyst that was patterned with a plurality of concentric "C" shapes having 75 nm wide lines. The MaCE process was performed using an etchant solution concentration of ρ=90. Other embedded shapes or circuits may also be produced. For example, FIG. 11 shows before and after SEM images of silicon etched with a Pt catalyst that was patterned using FIB deposition techniques. As shown in FIG. 11(a), a Pt circle with square cutouts was deposited on the silicon surface. The FIB machine limited the etched pattern to widths of 100 nm. More compact patterns may be achieved using higher resolution equipment and/or other patterning methods. Pillars were formed within a circular recess during the MaCE process as shown in FIG. 11(b). The pillars are 200 nm wide and 200 nm apart with an etching depth of about 600 nm. The perimeter taper is about 30° while the pillar taper is about 0°.

Figure 12:
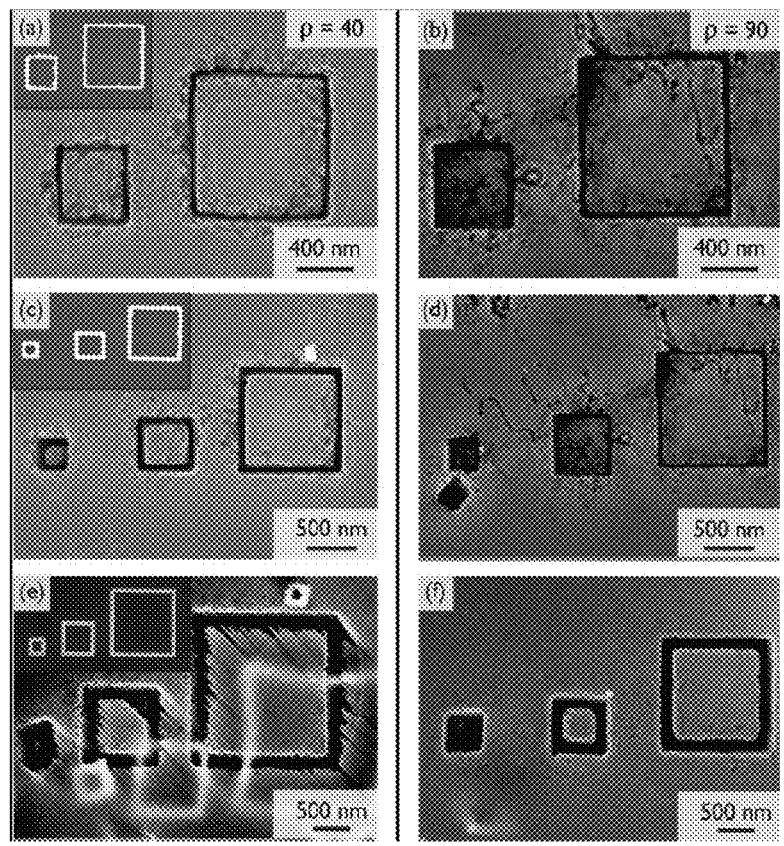

Square shaped metal catalysts continued the etching trend of the Au dog-bone shaped nanostructures with more complex shapes by creating additional boundary conditions that restrict catalyst motion to some degree. FIG. 12 includes SEM images of a silicon substrate etched with Au square catalysts during a MaCE process of 40 minutes. FIGS. 12(a) and 12(b) depict the channels etched by a line width of about 25 nm with etchant solution concentrations of ρ=40 and ρ=90, respectively. FIGS. 12(c) and 12(d) depict the channels etched by a line width of about 50 nm with etchant solution concentrations of ρ=40 and ρ=90, respectively. FIGS. 12(e) and 12(f) depict the channels etched by a line width of about 100 nm with etchant solution concentrations of ρ=40 and ρ=90, respectively. The insets show the original metal catalyst pattern before etching. The square catalysts having about 25 nm and about 50 nm line widths etched paths that were either perpendicular or nearly perpendicular to the silicon surface, while the square catalysts having about 100 nm line width catalyst etched paths at an angle, creating sloping channels. FIG. 12 reinforces the idea that line width and thickness of the metal catalyst plays an important role in determining catalyst direction.

Additionally, the square catalysts with 25 and 50 nm line widths etched beyond a depth of about 300 nm for silicon, providing an aspect ratio of about 6:1 (or greater for the 25 nm wide catalysts). In FIG. 12(e), the square catalysts with 100 nm line widths can be seen beneath the silicon surface for the etchant solution concentrations of ρ=40. The smaller (350 nm and 1 μm) squares are not deformed, while the larger 2 μm square is; indicating that, as expected, long, narrow structures are more prone to distortion during the MaCE process. Au grid catalysts with 50, 100, and 200 nm line widths etch straight, sliding, and spiral shapes that depend primarily on the line width of the catalyst and if the center squares remained filled with catalyst material. In addition, protrusions (or fingers) that extend from one or more sides of the grid pattern may influence the etching direction. Controlling the etching path may be possible by controlling etching parameters such as catalyst shape and composition, multiple layer catalysts, etchant composition, temperature, and more.

The silicon pillars formed in etchant solution concentrations of ρ=90 maintain their width over the entire length, while the pillars formed in etchant solution concentrations of ρ=40 appear to narrow toward their tip. This indicates that not only are more holes (h$^+$) generated with ρ=40 etchant solutions but that holes (h$^+$) generated near the silicon pillars are at least somewhat confined within the pillars, leading to a higher etching rate for the silicon pillars even after the catalyst particle has etched well over 1 μm into the silicon substrate.

Nanogrids have three translational DoF with some rotational freedom about the Z-axis. In general, 3D spiral etching was seen for filled-in catalyst patterns including protrusions such as shown in the SEM images of FIGS. 10(d) and 10(e) and FIG. 13. The Au grid patterns of FIG. 13 have 200 nm line widths with Au between the lines. Openings (e.g., cracks and gaps) between the lines and Au filling promote etching under the filled-in grid pattern. Protrusions (or fingers) that extend from one or more sides of the grid pattern may be varied to influence the direction of rotation. For example, varying the width, length, and/or shape of the protrusions along one or more sides of the grid can affect the direction of rotation of the metal catalyst pattern. Alternatively, varying the metals used to form the protrusions along a side of the grid may also affect the direction of rotation.

Figure 13:
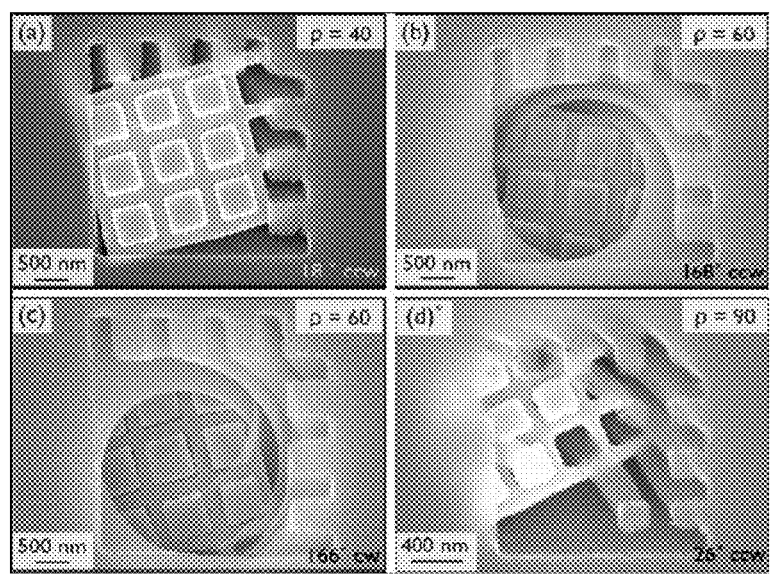

SEM images of spiral etching using filled-in Au grid patterns are shown in FIG. 13. The silicon substrates shown in FIGS. 13(a), 13(b)-(c), and 13(d) were etched for 20 minutes with an etchant solution concentration of ρ=40, 60, and 90, respectively. Rotation angles of 18° counter-clockwise (ccw), 162° ccw, and 168° clockwise (cw) about the centroid axis are depicted in FIGS. 13(a)-13(c), respectively. Noncentroid rotation of 26° ccw was also seen in FIG. 13(d). The substrate under the filled-in Au grid patterns is removed as the filled-in grid spirals into the substrate, thereby removing a volume of the substrate during the three-dimensional spiral etching. AFM measurements indicate that etching depths of up to 2.5 μm deep were achieved. The line widths of the fingers were 200 nm, providing an aspect ratio of at least 10:1; which is not only comparable to DRIE but MaCE does not leave the rough scalloping seen with DRIE. Extending the duration of the etching time will produce higher aspect ratios.

Figure 14:
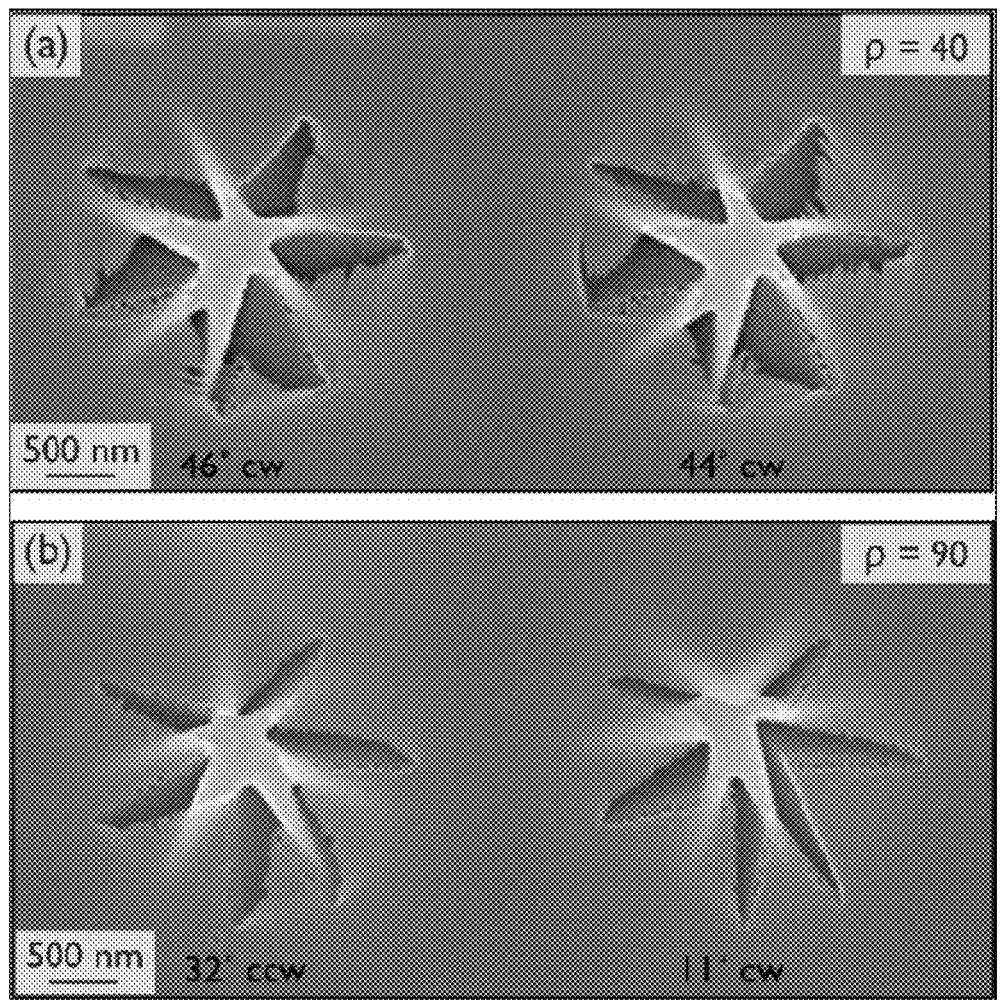

Star-shaped metal catalysts were also found to rotate during the MaCE process. The star-shape catalysts produced spiraling 3D patterns that rotated about the Z-axis as they etched into the silicon. FIG. 14 includes SEM images of spiral etching paths produced in silicon with Au nanostars after MaCE etching for 20 minutes. As shown in FIG. 14(a), the star-shaped catalysts in an etchant solution concentration of ρ=40 rotated 46 and 44° clockwise (cw) about an axis near their centroid with little translation in any direction other than the Z-axis. In FIG. 14(b), the star-shape catalysts in an etchant solution concentration of ρ=90 rotated 32° counter-clockwise (ccw) with no translation in X- or Y-directions, while the other star-shaped catalyst rotated 11° cw with 80 nm of translation in −X and 220 nm in −Y. The etchant solution concentration of ρ=40 shows lower feature resolution and an increase in nonlocalized etching in the spiraling directions, suggesting that the hole (h$^+$) density is higher in these areas. Overall, star-shaped catalysts have no translational DoF and one rotational DoF about the Z-axis.

Figure 15A:
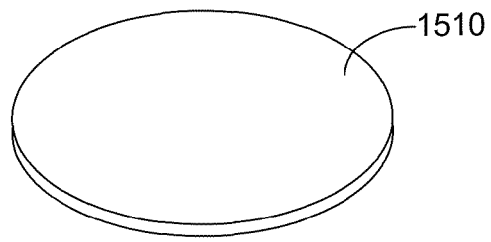
FIGS. 15A-15D are graphical representations of dicing a wafer using MaCE process of FIG. 1 in accordance with embodiments of the disclosure.
Figure 15B:
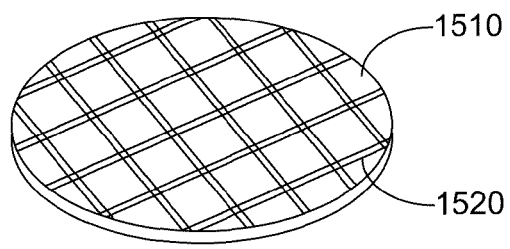
Figure 15C:
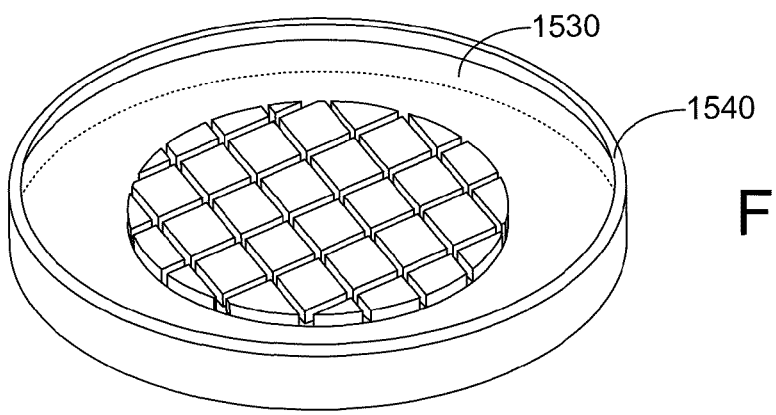
Figure 15D:
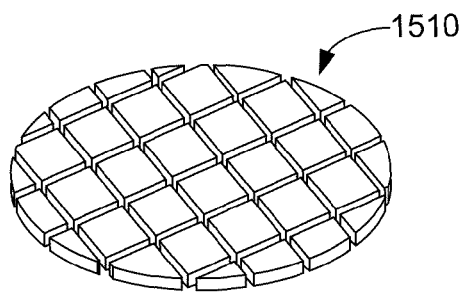

MaCE may also be utilized to dice a wafer into chips or portions of the substrate. FIGS. 15A-15D illustrate an exemplary method for dicing of a silicon wafer. To begin, in FIG. 15A, a silicon wafer 1510 is provided. A metal catalyst 1520 is then patterned on the surface of the silicon wafer 1510. In the exemplary embodiment, the metal catalyst 1520 is a square grid pattern. Other patterns such as rectangular, hexagonal, octagonal, non-symmetric patterns, or combinations thereof may be utilized or adapted to conform to the desired structure of the silicon wafer portions. The silicon wafer 1510 and metal catalyst 1520 are then exposed to an etchant solution 1530 in a bath 1540 as depicted in FIG. 15C. The MaCE process dices the silicon wafer 1510 as the metal catalyst 1520 travels through the silicon wafer 1510. The diced silicon wafer 1510 may then be removed from the etchant solution bath 1540, as shown in FIG. 15D, for further processing of the diced portions or chips.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. A method for metal-assisted chemical etching, comprising:
    providing a substrate;
    depositing a non-spherical metal catalyst on a surface of the substrate, the non-spherical metal catalyst including a first portion including a first metal deposited on the surface of the substrate and a second portion including a second material deposited on the surface of the substrate;
    etching the substrate by exposing the non-spherical metal catalyst and the substrate to an etchant solution including a composition of a fluoride etchant and an oxidizing agent; and
    removing the etched substrate from the etchant solution.

2. The method of claim 1, wherein the substrate is a silicon substrate.

3. The method of claim 1, wherein the metal is selected from the group consisting of gold, silver, platinum, and tungsten.

4. The method of claim 1, wherein the fluoride etchant is hydrofluoric acid (HF) and the oxidizing agent is hydrogen peroxide ($H_2O_2$).

5. The method of claim 1, wherein the non-spherical metal catalyst is patterned on the surface of the substrate.

6. The method of claim 5, wherein the patterned metal catalyst includes a grid comprising lines of the metal.

7. The method of claim 6, wherein the grid includes at least one protrusion extending from a first side of the grid.

8. The method of claim 6, wherein areas between the lines of the grid are filled with material.

9. The method of claim 5, further comprising:
    patterning a second non-spherical metal catalyst on a surface of the substrate; and
    further etching the substrate by simultaneously exposing the first and second non-spherical metal catalysts and the substrate to a second etchant solution.

10. The method of claim 9, where the second etchant solution has a composition that is the same as the first etchant solution.

11. A method for metal-assisted chemical etching, comprising:
    providing a substrate;
    depositing a non-spherical metal catalyst on a surface of the substrate;
    etching the substrate by exposing the non-spherical metal catalyst and the substrate to an etchant solution including a composition of a fluoride etchant and an oxidizing agent;
    applying a magnetic field to the metal catalyst to direct the etching path within the substrate; and
    removing the etched substrate from the etchant solution.

12. The method of claim 11, wherein the non-spherical metal catalyst is a nanoparticle positioned on the surface of the substrate.

13. The method of claim 12, wherein the metal catalyst is a nanodonut.

14. The method of claim 11, wherein the non-spherical metal catalyst is patterned on the surface of the substrate.

15. The method of claim 14, wherein the patterned metal catalyst is a dog-bone shaped nanostructure.

16. A method for metal-assisted chemical etching, comprising:
    providing a substrate;
    depositing a non-spherical metal catalyst on a surface of the substrate, the non-spherical metal catalyst including at least one protrusion extending from a side of the non-spherical metal catalyst;
    etching the substrate by exposing the non-spherical metal catalyst and the substrate to an etchant solution including a composition of a fluoride etchant and an oxidizing agent, the at least one protrusion producing rotational movement of the non-spherical metal catalyst through the substrate during exposure to the etchant solution; and
    removing the etched substrate from the etchant solution.

17. The method of claim 16, wherein the non-spherical metal catalyst is patterned on the surface of the substrate.

18. The method of claim 17, wherein the patterned metal catalyst includes a grid.

19. The method of claim 17, wherein the patterned metal catalyst is formed using a plurality of materials.

20. The method of claim 16, wherein the non-spherical metal catalyst includes a plurality of protrusions extending from the side of the non-spherical metal catalyst.

* * * * *